United States Patent
Drago et al.

(10) Patent No.: US 9,240,772 B2
(45) Date of Patent: Jan. 19, 2016

(54) FREQUENCY SYNTHESISER

(75) Inventors: Salvatore Drago, Eindhoven (NL); Fabio Sebastiano, Eindhoven (NL); Dominicus Martinus Wilhelmus Leenaerts, Reithoven (NL); Lucien Johannes Breems, Eindhoven (NL); Bram Nauta, Borne (NL)

(73) Assignee: NXP, B.V., Eindhoven (NL)

( * ) Notice: Subject to any disclaimer, the term of this patent is extended or adjusted under 35 U.S.C. 154(b) by 84 days.

(21) Appl. No.: 13/262,626

(22) PCT Filed: Mar. 30, 2010

(86) PCT No.: PCT/IB2010/051371
§ 371 (c)(1),
(2), (4) Date: Sep. 30, 2011

(87) PCT Pub. No.: WO2010/113108
PCT Pub. Date: Oct. 7, 2010

(65) Prior Publication Data
US 2012/0139587 A1    Jun. 7, 2012

(30) Foreign Application Priority Data

Apr. 3, 2009  (EP) .................................. 09157284
May 6, 2009  (EP) .................................. 09251261

(51) Int. Cl.
*H04B 1/38*  (2015.01)
*H03K 3/03*  (2006.01)
(Continued)

(52) U.S. Cl.
CPC .............. *H03K 3/0322* (2013.01); *H03K 3/012* (2013.01); *H03L 7/0802* (2013.01); *H03L 7/087* (2013.01);
(Continued)

(58) Field of Classification Search
CPC ..... H03L 7/10; H03L 7/0802; H03L 2207/50; H03L 7/087

USPC .......................................................... 375/219
See application file for complete search history.

(56) References Cited

U.S. PATENT DOCUMENTS 4,315,219 A * 2/1982 Rocheleau et al. ........... 327/106
5,467,294 A * 11/1995 Hu et al. ........................ 708/276
(Continued)

FOREIGN PATENT DOCUMENTS

CN   101090272 A    12/2007
WO   2009044368 A2   4/2009

OTHER PUBLICATIONS

Julien Ryckaert, Geert Van der Plas, Vincent De Heyn, Claude Desset Bart Van Poucke, and Jan Craninckx, "A 0.65-to-1.4 nJ/Burst 3-to-10 GHz UWB All-Digital TX in 90 nm CMOS for IEEE 802.15.4a", IEEE Journal of Solid-state circuit, vol. 42, No. 12, Dec. 2007.*
(Continued)

*Primary Examiner* — Daniel Washburn
*Assistant Examiner* — Berhanu Tadese

(57) ABSTRACT

A low power frequency synthesizer circuit for a radio transceiver, the synthesizer circuit comprising:
a digital controlled oscillator configured to generate an output signal ($F_o$) having a frequency controlled by an input digital control word (DCW);
a feedback loop connected between an output and an input of the digital controlled oscillator, the feedback loop configured to provide the digital control word to the input of the digital controlled oscillator from an error derived from an input frequency control word (FCW) and the output signal; and
a duty cycle module connected to the digital controlled oscillator and the feedback loop, the duty cycle module configured to generate a plurality of control signals to periodically enable and disable the digital controlled oscillator for a set fraction of clock cycles of an input reference clock signal (RefClock).

17 Claims, 8 Drawing Sheets

(51) Int. Cl.

| | |
|---|---|
| *H03K 3/012* | (2006.01) |
| *H03L 7/08* | (2006.01) |
| *H03L 7/087* | (2006.01) |
| *H03L 7/099* | (2006.01) |
| *H03L 7/10* | (2006.01) |
| *H03L 7/18* | (2006.01) |

(52) U.S. Cl.
CPC ............... *H03L 7/0995* (2013.01); *H03L 7/10* (2013.01); *H03L 7/18* (2013.01); *H03L 2207/06* (2013.01); *H03L 2207/50* (2013.01)

(56) References Cited

U.S. PATENT DOCUMENTS

| | | | | |
|---|---|---|---|---|
| 5,495,205 | A | 2/1996 | Parker et al. | |
| 6,052,034 | A | 4/2000 | Wang et al. | |
| 6,127,859 | A * | 10/2000 | Lim | 327/105 |
| 6,278,864 | B1 * | 8/2001 | Cummins et al. | 455/73 |
| 6,841,983 | B2 * | 1/2005 | Thomas | 323/322 |
| 7,236,557 | B1 * | 6/2007 | Nguyen | 377/47 |
| 7,372,340 | B2 * | 5/2008 | Xiu et al. | 331/45 |
| 7,590,210 | B2 * | 9/2009 | Aweya et al. | 375/356 |
| 7,613,266 | B1 * | 11/2009 | Talbot | 375/371 |
| 7,643,595 | B2 * | 1/2010 | Aweya et al. | 375/356 |
| 7,916,824 | B2 * | 3/2011 | Nagaraj et al. | 375/376 |
| 8,050,375 | B2 * | 11/2011 | Staszewski et al. | 375/373 |
| 2002/0043992 | A1 | 4/2002 | McCune | H03C 3/0933 327/105 |
| 2004/0120395 | A1 * | 6/2004 | Orr et al. | 375/237 |
| 2004/0196940 | A1 * | 10/2004 | Chien | 375/376 |
| 2005/0186933 | A1 * | 8/2005 | Trans | 455/296 |
| 2005/0189972 | A1 | 9/2005 | Foo et al. | |
| 2006/0034408 | A1 * | 2/2006 | Lin | 375/360 |
| 2006/0056560 | A1 * | 3/2006 | Aweya | H04J 3/0664 375/356 |
| 2006/0056563 | A1 * | 3/2006 | Aweya et al. | 375/376 |
| 2006/0145772 | A1 * | 7/2006 | Xiu | H03L 7/0995 331/45 |
| 2008/0043893 | A1 * | 2/2008 | Nagaraj et al. | 375/376 |
| 2008/0111639 | A1 * | 5/2008 | Ryckaert | H03K 3/0322 331/57 |
| 2008/0136468 | A1 * | 6/2008 | Li et al. | 327/122 |
| 2008/0315959 | A1 * | 12/2008 | Zhuang et al. | 331/17 |
| 2008/0317187 | A1 * | 12/2008 | Waheed et al. | 375/376 |
| 2008/0317188 | A1 * | 12/2008 | Staszewski | G04F 10/005 375/376 |
| 2009/0284288 | A1 * | 11/2009 | Zhang et al. | 327/118 |
| 2010/0216523 | A1 * | 8/2010 | Sebastiano et al. | 455/574 |

OTHER PUBLICATIONS

Pletcher, N.M. et al "A 52 W Wake-Up Receiver With 72 dBm Sensitivity Using an Uncertain-IF Architecture," Solid-State Circuits, IEEE Journal of , vol. 44, No. 1, pp. 269,280, Jan. 2009.*

Geert Van der Plas et al., "A 0.65-to-1.4 nJ/Burst 3-to-10 GHz UWB All-Digital TX in 90 nm CMOS for IEEE 802.15.4a" , IEEE Journal of Solid-State Circuits, vol. 42, No. 12, Dec. 2007.*

Van der Plas et al. ("A 0.65-to-1.4 nJ/Burst 3-to-10 GHz UWB All-Digital TX in 90 nm CMOS for IEEE 802.15.4a", IEEE Journal of Solid-state circuit, vol. 42, No. 12, Dec. 2007).*

Pletcher, N.M. et al "A 52 W Wake-Up Receiver With 72 dBm Sensitivity Using an Uncertain-IF Architecture," Solid-State Circuits, IEEE Journal, Jan. 2009.*

Van der Plas et al., "A 0.65-to-1.4 nJ / Burst 3-to-10 GHz UWB All-Digital TX in 90 nm CMOS for IEEE 802.15.4a", IEEE Journal of Solid-state circuit, vol. 42, No. 12, Dec. 2007.*

Moe Z. Win et al., "Impulse Radio: How It Works", IEEE Communications Letters, vol. 2, No. 2, Feb. 1998.*

Kajiwara, A. et al. "A New PLL Frequency Synthesizer with High Switching Speed", IEEE Transactions on Vehicular Technology, vol. 41, No. 4, pp. 407-413 (Nov. 1992).

Staszewski, R. B. et al. "Phase-Domain All-Digital Phase-Locked Loop", IEEE Transactions on Circuits and Systems-II: Express Briefs, vol. 52, No. 2, pp. 159-163 (Mar. 2005).

Cook, B. W. et al. "An Ultra-Low Power 2.4GHz RF Transceiver for Wireless Sensor Networks in 0.13µm CMOS with 400mV Supply and an Integrated Passive RX Front-End", Solid-State Circuits Conf., ISSCC 2006, Digest of Technical Papers, IEEE, pp. 1460-1469 (2006).

Wentzloff, D. D. et al. "A 47pJ/pluse 3.1-to-5GHz All Digital UWB Transmitter in 90nm CMOS", IEEE International Solid-State Circuits Conference, 4 pgs., (2007).

Ryckaert, J. et al. "A 0.65-to-1.4 nJ/Burst 3-to-10 GHz UWB All-Digital TX in 90 nm CMOS for IEEE 802.15.4a", IEEE Journal of Solid-State Circuits, vol. 42. No. 12, pp. 2860-2869 (Dec. 2007).

Sebastiano, F. et al. "Impulse Based Scheme for Crystal-less ULP Radios", Circuits and Systems, ISCAS IEEE International Symposium, pp. 1508-1511 (2008).

Drago, S. et al. "A 200 µA duty-cycles PLL for WSN", 35th European Solid-State Circuits Conference, ESSCIRC 09, 4 pgs. (Sep. 2009).

Pletcher, N. M. et al. "A 52 µw Wake-Up Receiver With—72 dBm Sensitivity Using an Uncertain-IF Architecture", IEEE Journal of Solid-State Circuits, vol. 44, No. 1, pp. 269-280 (Jan. 2009).

International Search Report for Patent Application No. PCT/IB2010/051371 (Oct. 7, 2010).

* cited by examiner

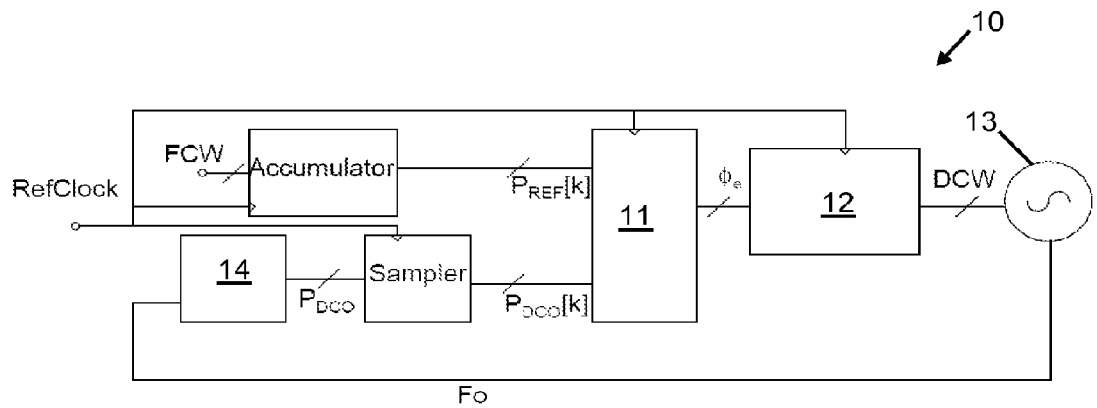
Prior Art  Fig. 1
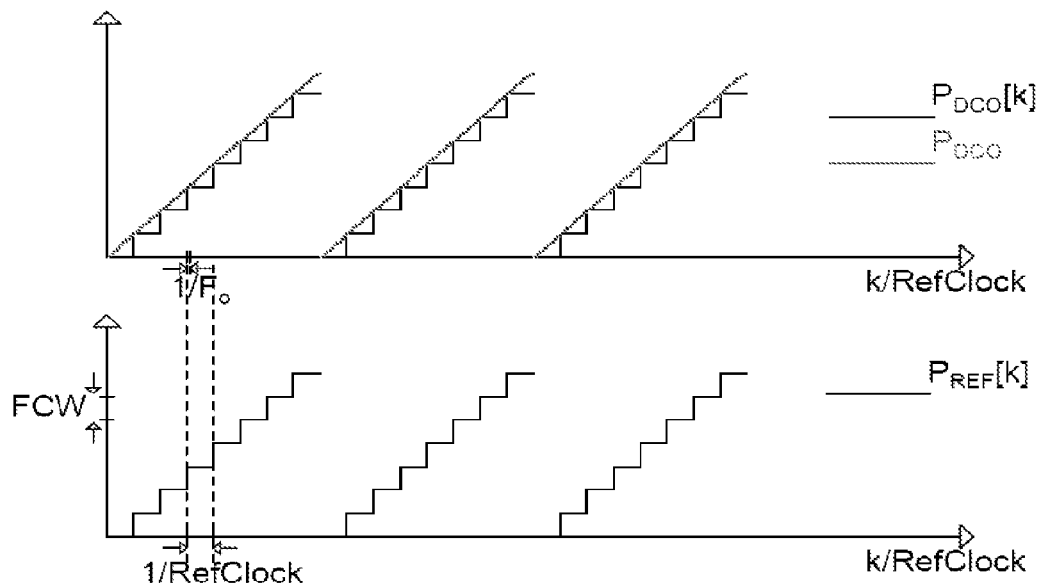
Prior Art  Fig. 2

FREQUENCY SYNTHESISER

The invention relates to digital phase-locked loop circuits for use as frequency synthesisers in, for example, ultra low power (ULP) pulse-based radio transceivers.

Down-conversion RF receiver architectures require frequency synthesizers in order to translate a received RF signal to a much lower frequency where channel filtering can be performed with a low-Q filter. Frequency synthesizers are also used to up-convert baseband information to an RF frequency for wireless communications. Synthesizers in RF transceivers must be able to provide a clean (i.e. low noise) frequency signal with very high absolute accuracy over an expected range of process voltage and temperature (PVT) variations, and are usually the most power-hungry blocks in a transceiver.

In impulse radio (IR) based transceivers, particularly in the context of low data rate ultra low power (ULP) radios, transmitted signals consist of a sequence of short duration pulses with a high RF centre frequency and a fixed pulse repetition frequency (PRF). Data can be encoded by changing either the phase, the amplitude, the frequency or the position of pulses realizing respectively the well-known modulation schemes of PSK (phase shift keying), OOK (on-off keying), FSK (frequency shift keying) or PPM (pulse-position modulation) [5]. A reduction in the energy used in receiving and in transmitting modes is mainly obtained by duty-cycling the system, i.e. by putting the system into a 'sleep mode' for a significant fraction of the time in use.

The circuits in a typical receiver signal path, such as a low-noise amplifier (LNA), mixer and IF amplifier, can be duty-cycled according to the PRF of the signal. Moreover, the frequency used to down convert the RF signal can be generated in burst mode and in synchronization with the incoming pulse by means of a digital controlled oscillator (DCO) operating in an open loop mode and periodically calibrated. At the transmitter side, a calibrated pulse generator is typically used, which avoids the use of a power-hungry oscillator, to up-convert the baseband information. At the receiver side, in order to achieve ultra low power operation a duty-cycled down-conversion architecture is combined with a burst mode and a periodically calibrated free-running DCO.

By duty-cycling all the transceiver blocks at the pulse level, i.e. by shutting down the complete radio, including the frequency generating system, between transmitted or received pulses, a highly energy-efficient system can be realized.

High frequency synthesizers are often the most power hungry blocks in Wireless Sensor Networks (WSN) [3]. They need to be accurate, and considerable effort has been devoted to the realization of low-power PLLs with sufficient accuracy.

In references [3] and [4] below, a free-running digital controlled oscillator (DCO) is periodically calibrated. Although the inherently reduced complexity makes the above described architectures extremely energy efficient, the associated susceptibility to temperature and voltage variations between successive calibration steps makes the use of a free-running DCO (i.e. without closed-loop regulation of the centre frequency) impractical for most applications. In practice, temperature and voltage supply variations are not predictable and may cause a large drift in the generated frequency, which cannot be tolerated. Moreover, the accuracy in the generated frequency is limited to a few percent.

The traditional way of improving stability and accuracy of the generated RF frequency is to embed the DCO in a feedback loop, in the form of a phase-locked loop circuit (PLL). Known arrangements are disclosed in references [1] and [2] cited below. The output frequency is then a multiplied copy of the lower reference frequency, which is usually insensitive to PVT variations. Reference [2], for example, discloses a digital controlled oscillator designed to operate at frequencies orders of magnitude higher, around 2.4 GHz, than that supplied by a crystal oscillator reference frequency of around 10-40 MHz.

Conventional PLLs can achieve an accuracy of a few ppm (parts per million), but are usually designed to meet stringent phase noise and spectral purity requirements. These lead to high power consumption, which is not suitable for use in ULP applications such as for WSN nodes.

FIG. 1 illustrates a simplified block diagram of a modern phase domain all-digital phase locked loop circuit (ADPLL) 10, similar to that described in reference [1] below. The associated DCO and reference phase signals for the circuit 10 are shown in FIG. 2. The DCO phase signal $P_{DCO}$ is determined by counting the number of rising clock transitions of the output frequency $F_o$. The reference phase $P_{REF}[k]$ is obtained by accumulating the frequency command word (FCW) at every rising edge of the frequency reference clock (RefClock). The sampled DCO phase signal $P_{DCO}[k]$ is subtracted from the reference phase $P_{REF}[k]$ by a synchronous arithmetic phase detector 11. The digital phase error $\phi_e$ thereby obtained is conditioned by a digital loop filter 12, which provides the digital control word (DCW) for the DCO 13.

The DCO control word DCW changes the DCO frequency output $F_o$ in a direction that tends to reduce the phase difference between the reference phase signal $P_{REF}[k]$ and the DCO phase signal $P_{DCO}[k]$.

As the RefClock is generally a constant frequency (since it is typically obtained from a stable crystal oscillator), the reference phase signal $P_{REF}[k]$ is a linear time function and its slope, FCW·RefClock, corresponds to the desired frequency.

When the PLL is locked, the error in phase between $P_{REF}[k]$ and $P_{DCO}[k]$, and hence the error in frequency, is on average zero; the output frequency is a multiplied copy of the stable reference frequency. A disadvantage of this type of arrangement is the high power requirement for the DCO and the counter 14. Because these components are always active, this kind of frequency synthesizer would not generally be suitable for ULP applications, where the power consumption should be minimized.

In WSN nodes, which are characterized by low activity, PLLs can be duty-cycled to save power. This suggests that the PLL should be operated in a "burst mode", in which short bursts of generated signals are separated by long idle periods in which energy is saved. Although burst mode PLLs are less accurate than conventional PLLs, the achievable frequency accuracy can easily meet the requirements of WSN applications, as disclosed in reference [5]. Moreover, a PLL, because of its closed loop nature is less prone to frequency drift than a free running oscillator.

A problem, however, with burst-mode PLLs is that special architectures are required to ensure stability and fast start-up circuitry to avoid extra power consumption during the transitions between active and idle periods.

An object of the invention is to provide a frequency synthesizer for an ultra-low power RF transceiver that is able to operate in burst mode while also maintaining a low frequency error.

In accordance with the invention there is provided a low power frequency synthesiser circuit for a radio transceiver, the synthesiser circuit comprising:

a digital controlled oscillator configured to generate an output signal having a frequency controlled by an input digital control word;

a feedback loop connected between an output and an input of the digital controlled oscillator, the feedback loop configured to provide the digital control word to the input of the digital controlled oscillator from an error derived from an input frequency control word and the output signal; and a duty cycle module connected to the digital controlled oscillator and the feedback loop, the duty cycle module configured to generate a plurality of control signals to periodically enable and disable the digital controlled oscillator for a set fraction of clock cycles of an input reference clock signal.

The invention aims to reduce the power consumption of a frequency synthesizer utilising a digital phase-locked loop by means of duty cycling the operation of the PLL, while maintaining a precise definition of the output frequency despite PVT variations.

The feedback loop is optionally configured to store a digital control word in response to one of the plurality of control signals and to use the stored digital control word in controlling the digital controlled oscillator when the digital controlled oscillator is subsequently enabled. An advantage of storing the digital control word between pulses is that the digital controlled oscillator is maintained in a calibrated state, reducing the need for adjustments when subsequently enabled, and thereby reducing the start-up period of the oscillator.

The duty cycle module optionally comprises, or is in the form of, a finite state machine (FSM) configured to generate the plurality of control signals driven by the reference clock signal. A finite state machine can be configured to generate a set sequence of timed signals for control of different parts of the oscillator and feedback loop, to ensure that these different parts are enabled and disabled with a timing that maintains operation of each part to a minimum time and thereby minimises power requirements.

The digital controlled oscillator optionally comprises a current-controlled ring oscillator and a digital to analog converter configured to receive the digital control word and to provide a current to the ring oscillator that determines the frequency of the output frequency signal. Ring oscillators are able to start up faster than LC oscillators, and are therefore preferred, due to the need for the oscillator to be started up sufficiently quickly for the output signal to be reasonably stable at the start of each pulse.

The ring oscillator will typically comprise a plurality of delay stages arranged in a closed loop, the output frequency of the oscillator being controllable by complementary input voltages applied to each of the delay stages.

The ring oscillator typically also comprises a pair of capacitors arranged to store the complementary input voltages when the digital controlled oscillator is disabled, which reduce the start-up period of the oscillator as the voltages applied during a previous pulse remain stored on the capacitors.

The digital to analog converter of the digital controlled oscillator preferably comprises an R/2R resistor network.

The duty cycle module is optionally configured to provide a control signal to enable the digital controlled oscillator in a preset phase using the stored digital control word one or more reference clock cycles prior to enabling the DCO. During this preset phase, the complementary input voltages can be adjusted according to the frequency control word input prior to the signal being generated, thereby increasing the frequency accuracy of the output signal while keeping operation of the oscillator to a minimum to save power.

The duty cycle module may be configured to modulate the temporal position of successive pulses generated by the digital controlled oscillator according to an input data signal. Such a pulse position modulation (PPM) scheme can allow for a simple way of encoding data on to the output of the synthesiser, particularly in cases where a high bit rate is not required.

The feedback loop typically comprises a counter module and a phase difference module, the counter module being configured to count cycles of the output signal from the digital controlled oscillator while the digital controlled oscillator is enabled and to provide a output phase signal to the phase difference module, the phase difference module configured to receive the input frequency control word and the output phase signal and to provide an error signal output to determine the digital control word.

The duty cycle module may be configured to reset the counter when enabling the digital controlled oscillator with one of the plurality of control signals.

The feedback loop may comprise a first feedback loop configured to provide a first part of the digital control word for coarse control of the output frequency of the digital controlled oscillator and a second feedback loop configured to provide a second part of the digital control word for fine control of the output frequency of the digital controlled oscillator. The use of a second feedback loop for fine frequency control allows for fine tuning to align the last rising edge of the DCO output with the reference clock edge, reducing the total error and improving accuracy.

The first and second feedback loops optionally comprise an accumulator module configured to provide respective parts of the digital control word and to store the parts of the digital control word when the digital controlled oscillator is disabled. Each accumulator thereby maintains the calibration state of the oscillator between pulses, preventing the oscillator from drifting out of alignment with the set frequency.

The first feedback loop may be configured to control the number of cycles of the output frequency signal of the digital controlled oscillator between successive transitions of the reference clock signal, while the second feedback loop is configured to minimise a time difference between transitions of the output frequency signal of the digital controlled oscillator and corresponding transitions in the reference clock signal.

Each of the feedback loops may comprise an accumulator module configured to provide respective parts of the digital control word and to store the parts of the digital control word when the digital controlled oscillator is disabled.

The first feedback loop may be configured to alter a more significant respective part of the digital control word only when a number of cycles of the output frequency signal between successive reference clock signal transitions differs from the number of cycles indicated by the frequency control word by one or more cycle. This may be achieved by having a deadband in the transfer characteristic of a summing module in the first feedback loop, for example in the form of a horizontal deadband in the relationship between an output error signal of the summing module and a difference between the frequency control word and the number of cycles of the output frequency signal between successive transitions of the reference clock signal.

The second feedback loop, however, may be configured to alter a less significant respective part of the digital control word by one or more bits to minimise a time difference between transitions of the output frequency signal and corresponding transitions in the reference clock signal. This may be achieved by having a deadband in the transfer characteristic of a summing module of the second feedback loop, for example in the form of a vertical deadband in the relationship between an output error signal of the summing module and the difference between the frequency control word and the number of cycles of the output frequency signal between successive transitions of the reference clock signal.

The duty cycle module is preferably configured to provide one of the plurality of control signals to the digital controlled oscillator to cause the digital controlled oscillator to be enabled in a preset phase to receive the stored digital control word prior to enabling the digital controlled oscillator for generating the output signal. By presetting the oscillator for one reference clock cycle prior to providing the output signal, the oscillator is allowed to settle to a desired frequency, thereby improving the overall accuracy of the output.

The frequency synthesiser of the invention is preferably implemented as a module in an integrated circuit, for example forming part of an integrated circuit for a wireless sensor network.

Imposing a duty cycle on the frequency generating circuitry of the phase-locked loop allows the circuit to operate at significantly reduced power levels compared with existing digital phase-locked loop circuits. This enables a phase-locked loop circuit in accordance with the invention to operate in a burst mode, thereby realizing an ultra low power frequency synthesizer while providing sufficient frequency accuracy required by radio transceivers for wireless sensor network applications.

A particular advantage of a digital phase-locked loop circuit according to the invention is that of improved energy efficiency with a reduced sensitivity to process voltage and temperature (PVT) variations.

The invention allows for the generation of a train of pulses with a highly accurate centre frequency. This in turn allows the duty cycle module to modulate the train of pulses to directly encode information to be transmitted to the RF bandwidth.

BRIEF DESCRIPTION OF DRAWINGS

The invention will now be described by way of example and with reference to the appended drawings, in which:

FIG. 1 is a schematic block diagram of a phase domain all-digital phase-locked loop circuit (ADPLL);

FIG. 2 illustrates DCO and reference phase signals for the PLL of FIG. 1;

FIGS. 11a and 11b illustrate the measured output of an exemplary duty-cycled ADPLL, FIG. 11b showing a magnified view of the signal in FIG. 11a;

SPECIFIC DESCRIPTION OF THE EMBODIMENTS

Figure 3:
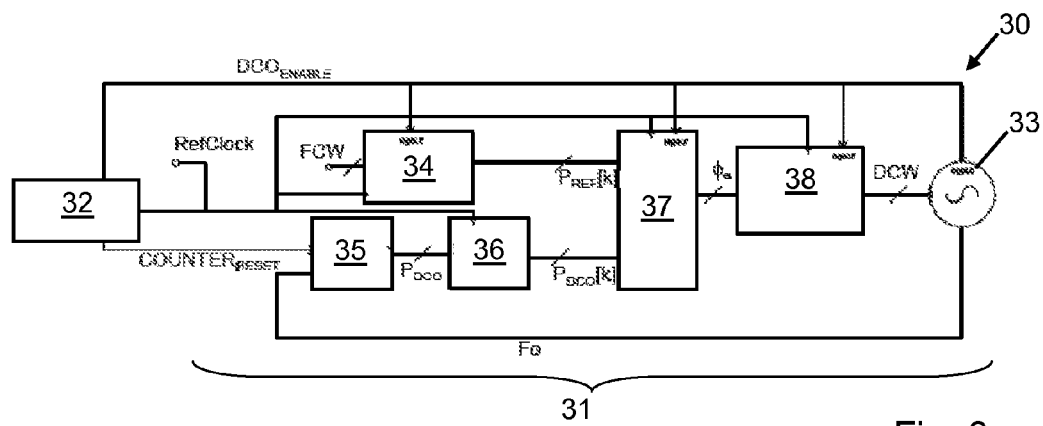
FIG. 3 is a schematic block diagram of a duty-cycled ADPLL.

The aim of the invention is to generate a train of pulses with a fixed time width and with a centre frequency which is locked to the reference clock frequency (RefClock), typically being a multiple of the reference clock frequency. FIG. 3 depicts a schematic block diagram of an exemplary frequency synthesiser 30, comprising a phase domain all-digital frequency-locked loop (ADFLL) 31 and a finite state machine (FSM) 32 as a duty-cycling module. All the blocks in the ADFLL 31 are gated in order to reduce the power consumption between the generation of two successive IR pulses. With proper synchronization, stability of the feedback loop is maintained and the output frequency from the DCO 33 is locked to the stable reference frequency input RefClock with low power consumption.

In a general aspect, the frequency synthesiser circuit 30 comprises a feedback loop 31 having a counter module 35, 36 and a phase difference module 34, 37, the counter module 35, 36 being configured to count cycles of the output signal Fo from the digital controlled oscillator 33 while the digital controlled oscillator 33 is enabled and to provide a output phase signal $P_{DCO}[k]$ to the phase difference module 34, 37, the phase difference module configured to receive the input frequency control word FCW and the output phase signal $P_{DCO}[k]$ and to provide an error signal output $\phi_e$ to determine the digital control word DCW.

Figure 4:
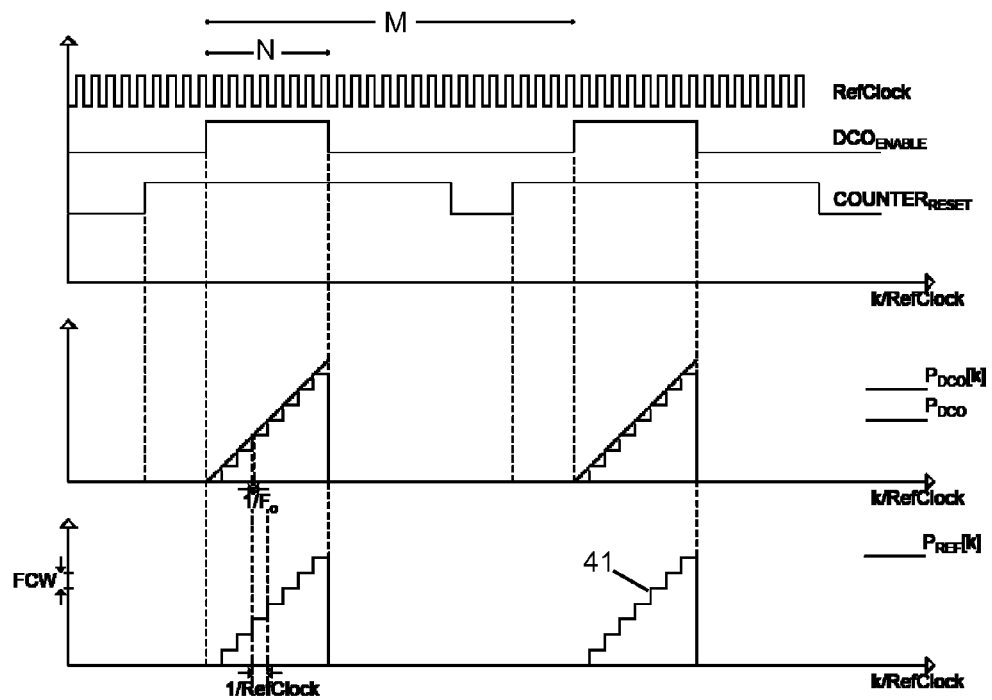
FIG. 4 illustrates synchronisation, DCO phase and reference phase signals for the duty-cycled ADPLL of FIG. 3.

FIG. 4 shows the synchronization signals provided by the duty-cycling module 32 and the phase signals associated with operation of the synthesiser 30. The DCO 33 is enabled, or activated, for N clock cycles of the reference clock RefClock and is disabled, or switched off, during the remaining M-N clock cycles, where M is the ratio between the RefClock and the pulse repetition frequency PRF. The average power consumption then scales proportionally to the duty-cycle factor $$\frac{N}{M}.$$

The reference phase $P_{REF}[k]$ is obtained by accumulating the frequency command word (FCW) at every rising edge of the RefClock signal 43 (FIG. 4). Since the accumulator 34 (FIG. 3) is gated by the synchronization signal $DCO_{ENABLE}$ 44 from the duty cycle module 32, the reference phase $P_{REF}[k]$ is in the form of a duty-cycled saw-tooth signal 41 (FIG. 4). The modulus of the accumulator 34 is chosen to be equal to N in order to fix the initial phase of each cycle of the saw-tooth signal 41 to zero. The DCO phase signal $P_{DCO}$ 45 is determined by counting, by the counter 35, the number of rising clock transitions of the output frequency $F_o$. In order to align the initial DCO phase with the initial reference phase, the counter 35 is reset before activation of the DCO 33 by means of the $COUNTER_{RESET}$ synchronization signal 46 from the duty cycle module 32. The sampled DCO phase $P_{DCO}[k]$ 42 output by the sampler 36 is subtracted from the reference phase $P_{REF}[k]$ 41 in a synchronous arithmetic phase detector 37. The digital phase error $\phi_e$ output from the phase detector 37 is conditioned by a digital loop filter 38, for example in the form of a FIR (finite impulse response) loop filter, the output of which provides the digital control word (DCW) for the DCO 33.

Since the Phase Detector 38 and the loop filter 38 are gated, the last sampled phase on each burst, together with the memory of the loop filter, is used to derive the initial control word for a subsequent burst. This information is stored while the system is turned off between bursts. Therefore, in a general aspect, the feedback loop of the ADFLL 31 is configured to store a digital control word in response to one of a plurality of control signals output from the duty cycle module 32 and to use the stored digital control word DCW in controlling the digital controlled oscillator 33 when the digital controlled oscillator 33 is subsequently enabled.

The DCO control word DCW changes the output frequency of the DCO 33 in a direction that tends to reduce the phase difference between the reference phase signal $P_{REF}[k]$ 41 and the sampled DCO phase signal $P_{DCO}[k]$ 42.

When the PLL 31 is locked, $P_{REF}[k]=P_{DCO}[k]$ and the output from the DCO 31 consists of a train of pulses with a centre frequency that is a multiple of the RefClock reference frequency, which is usually insensitive to PVT variations.

In a preferred embodiment, all the blocks 33-38 are activated for only for a fraction of time, given by the ratio $$\frac{N}{M}.$$

Figure 5A:
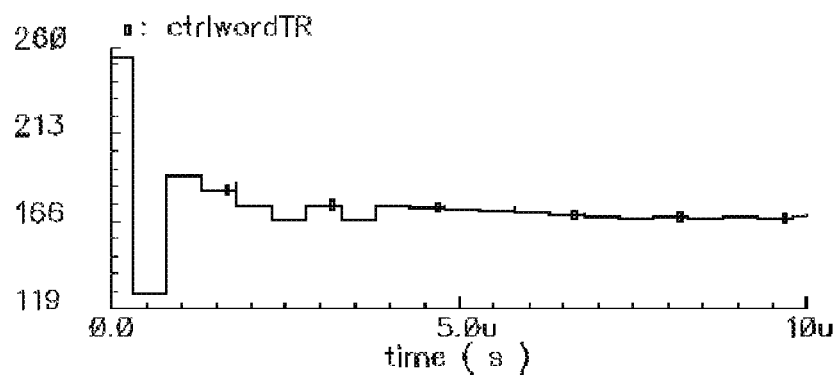
FIGS. 5a, 5b and 5c illustrate a) the DCO control word, b) the instantaneous output frequency and c) the output voltage signal of an exemplary duty-cycled ADPLL system as a function of time.
Figure 5B:
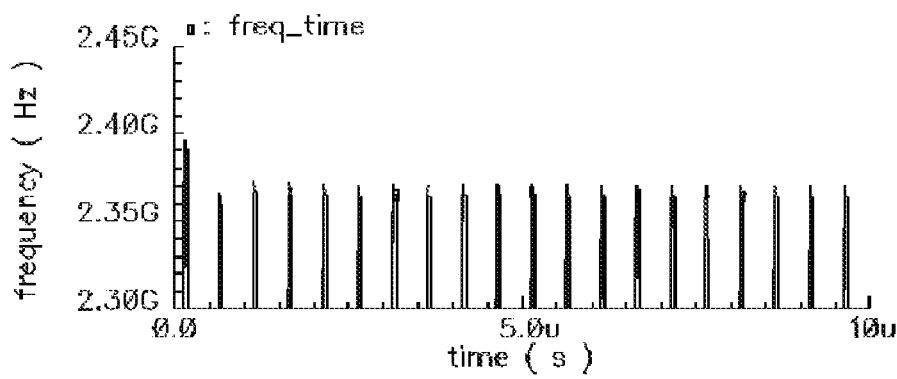
Figure 5C:
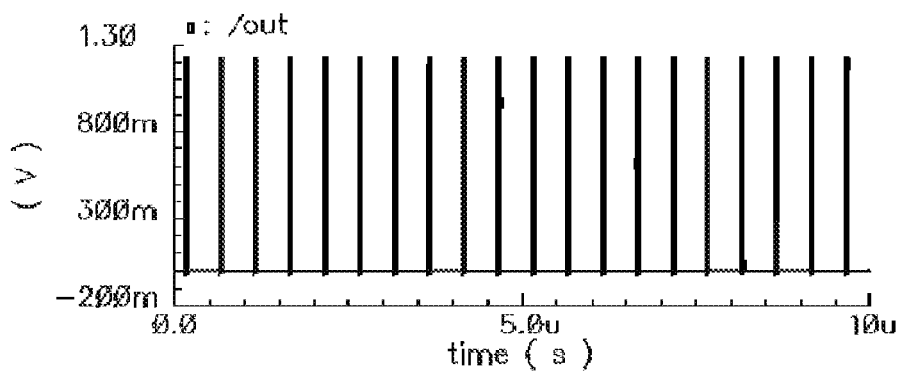

FIGS. 5a, 5b and 5c illustrate simulation results for a particular embodiment, where the RefClock and FCW are set to 20 MHz and 119, respectively. The duty cycle factor is chosen to be $$\frac{N}{M} = \frac{1}{10},$$

resulting in an order of magnitude power saving compared with a non-duty-cycled ADPLL. The DCO control word DCW 51 (FIG. 5a) changes over time to fix the centre frequency of the pulses to the desired frequency given by the frequency control word. The instantaneous output frequency (FIG. 5b) settles to the frequency given by FCW·RefClock (2.38 GHz in the example shown). The output of the duty-cycled frequency synthesizer 33 (FIG. 3), as shown in FIG. 5c, is in the form of a train of pulses with a PRF given by $$\frac{RefClock}{M} = 2 \text{ MHz}$$

and a centre frequency equal to 2.38 GHz.

Figure 6:
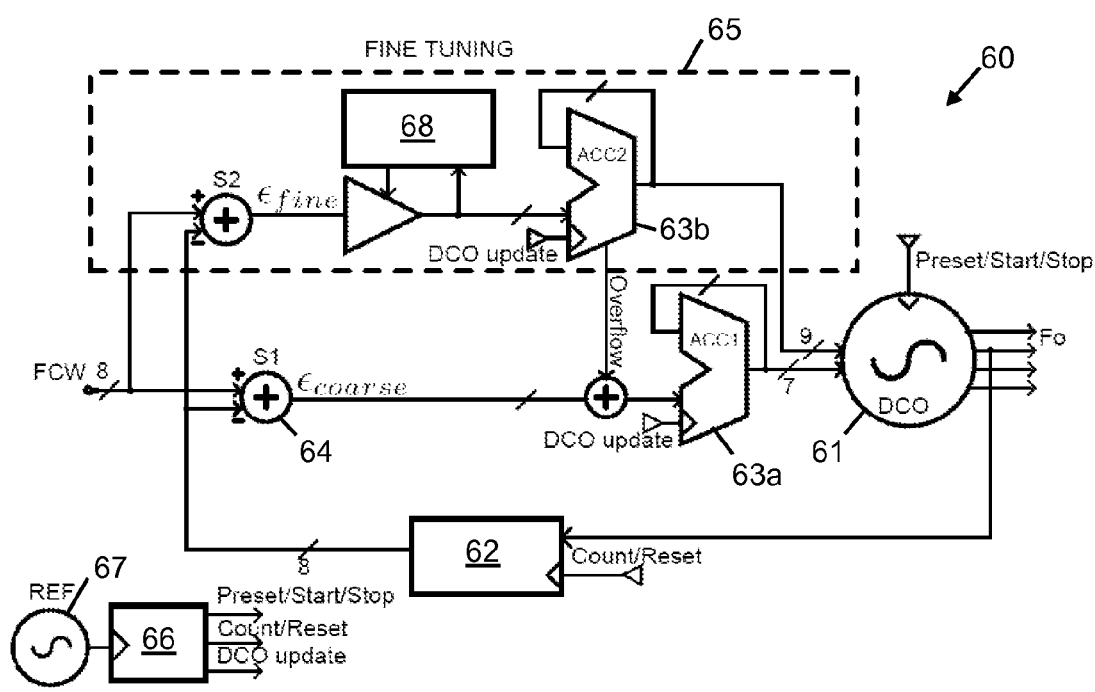
FIG. 6 is a schematic block diagram of an alternative embodiment of a duty-cycled ADPLL.

A frequency synthesiser according to the present invention can be used at the transmitter side as a pulse generator. By means of the duty-cycle module 32, it is possible to modulate, according to input data, the temporal position of each successive pulse, realizing pulse position modulation (PPM). The resulting signal will already be in the RF bandwidth and no additional power-hungry local frequency generators are required for up-conversion. In a general aspect therefore, the duty cycle module may be configured to modulate the temporal position of successive pulses generated by the digital controlled oscillator according to an input data signal A simplified block diagram of an embodiment of a duty-cycled PLL (DCPLL) frequency synthesiser according to the invention is shown in FIG. 6. The main loop of the synthesiser 60 consists of a DCO 61, a counter 62, an accumulator (ACC1) 63a and one digital subtractor (S1) 64. A second fine tuning loop 65 comprising a second accumulator (ACC2) 63b may be employed to increase the accuracy of the output frequency signal from the DCO 61. Both loops are controlled in an efficient manner by a finite state machine (FSM) 66 connected to an input reference signal generator 67, the FSM 66 being configured to provide three control signal output lines: i) a preset/start/stop signal line connected to the DCO 61, ii) a count/reset signal line connected to the counter 62, and iii) a DCO update line connected to the accumulators 63a, 63b.

According to an exemplary embodiment, the DCO 61 illustrated in FIG. 6 comprises a current-controlled ring oscillator and a 16-bit digital-to-analog converter (DAC), having 7 bits for coarse frequency acquisition and 9 bits for fine tuning.

Figure 7:
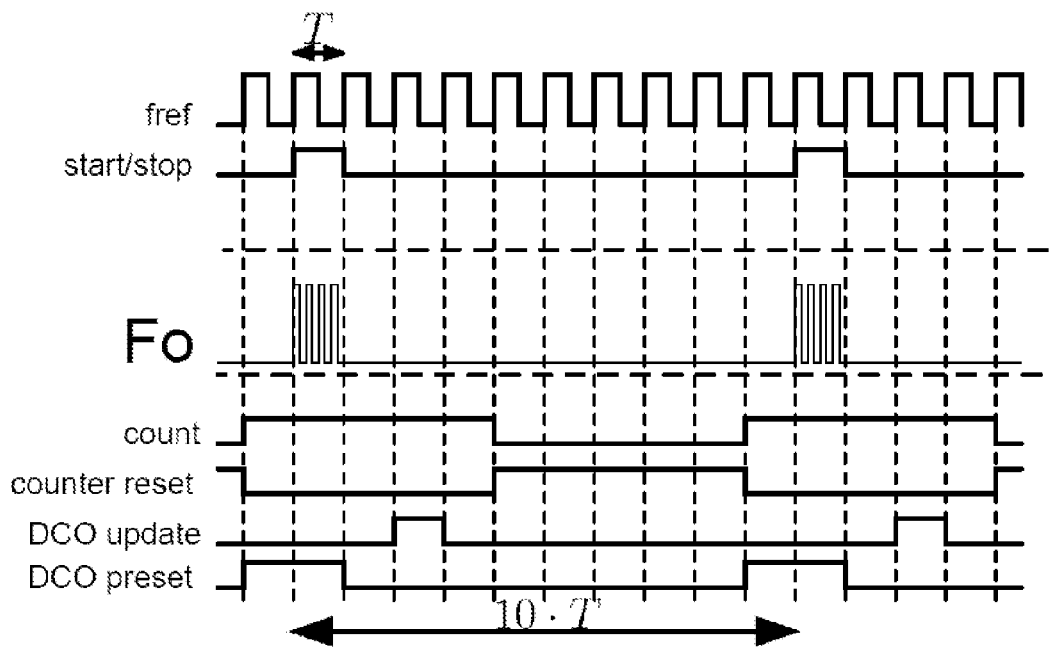
FIG. 7 illustrates various waveforms used in the duty-cycled ADPLL of FIG. 6.

The reference clock signal generator 67 generates a reference clock signal with a frequency REF of 20 MHz, which drives the FSM 66. The FSM 66 generates the various control signals from this, illustrated in the timing diagrams shown in FIG. 7. In this particular embodiment, the PLL is enabled for 1 out of every 10 cycles of the reference clock signal fref, i.e. N=1, M=10. The DCO 61 is periodically turned on and off by the DCO start/stop signal, while the two loops ensure that the output frequency of the DCO 61 is locked to the reference clock signal REF. After a sleep time of M−1=9 reference clock cycles, the DCO 61 is started up and allowed to run for N=1 reference clock cycle, i.e. for a period T=50 ns. The resulting integer generated by the counter 62 is compared with the desired frequency control word (FCW) and the resulting error signal updates the DCW stored in the accumulator. Since the error is computed one reference clock cycle after the DCO is stopped, the counter 62 can be implemented as a simple asynchronous D-FF-based counter.

When locked, the number of DCO output rising edges between two reference edges is equal to the programmable FCW. With the $$DCO \frac{N}{M} = \frac{1}{10}$$

duty-cycled, its output frequency Fo is given by:

$$F_o = FCW \cdot REF \quad (1)$$

Figures 8A, 8B:
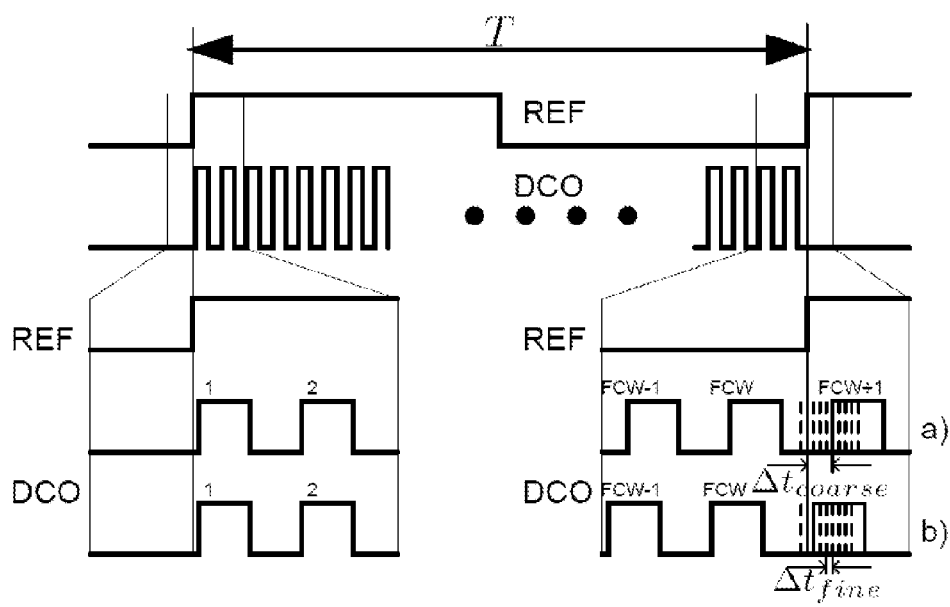
FIGS. 8a and 8b illustrate a) coarse acquisition and b) fine tuning of the duty-cycled ADPLL of FIG. 6.

Conceptually a single loop should be sufficient. However, as shown in FIG. 8a, the DCO rising edge 81 at reference clock pulse FCW+1 might be delayed by $\Delta t_{coarse}$ with respect to the reference rising edge 82. This would result in a worst-case frequency error equal to REF. Significantly better performance can be achieved if, in conjunction with the main loop used for handling coarse frequency acquisition, an additional loop 65 (FIG. 6) is employed for fine frequency tuning. A small increase $\Delta f_{fine}$ in the DCO output frequency signal advances the last DCO edge by a time interval $\Delta t_{fine}$ (FIG. 8b), which is given by:

$$\Delta t_{fine} \simeq \frac{\Delta f_{fine}}{REF} T_{DCO} \quad (2)$$

where $T_{DCO}$ is a DCO period. Before each burst generation, the fine tuning loop 65 increases the DCW by a least significant bit (LSB), thereby increasing the DCO frequency by a small step Δffine until the DCO edge at pulse (FCW+1)

only just leads the reference clock edge 82. At this point, the fine tuning loop increases or decreases the DCW by 1 LSB depending on whether the (FCW+1)$_{th}$ DCO edge 81 leads or lags the reference clock edge 82. Burst by burst, the frequency then varies by $\pm \Delta f_{fine}$ and so the last DCO edge oscillates around the reference clock edge. While the main loop controls the number of rising edges occurring between two successive reference clock edges, the fine tuning loop 65 decreases the delay between the last DCO rising edge and the reference clock edge. The total error is reduced and the accuracy is improved, as shown in FIG. 8b.

In a general aspect therefore, the feedback loop of the synthesiser 60 comprises a first feedback loop configured to provide a first part of the digital control word for coarse control of the output frequency of the digital controlled oscillator 61 and a second feedback loop 65 configured to provide a second part of the digital control word for fine control of the output frequency of the digital controlled oscillator 61.

The quantization error in the frequency generated by the above dual loop configuration is proportional to $\Delta f_{fine}$. This error can be minimized by increasing the DCO resolution. However, in a low power implementation, the accuracy is limited by the DCO's phase noise and, hence, by the total power available. In preferred implementations, $\Delta f_{fine}$ is chosen to be low enough to make the quantization noise negligible with respect to the phase noise.

Figures 9A, 9B:
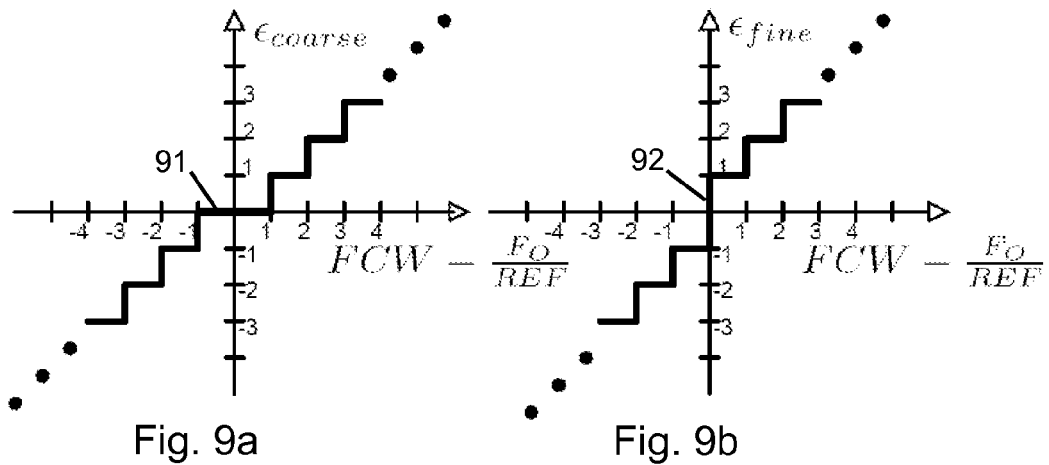
FIGS. 9a and 9b illustrate transfer characteristics of the counter and subtractor blocks of the duty-cycled ADPLL of FIG. 6 for a) course acquisition and b) fine tuning.

Since the PLL operates in burst mode, the fine tuning operation does not require a power hungry "bang-bang" phase detector, but only requires simple logic circuits. FIGS. 9a and 9b illustrate the combined transfer characteristic of the counter and subtractor for the coarse acquisition loop (FIG. 9a) and the fine tuning loop (FIG. 9b). In the transfer characteristic of the coarse acquisition loop, a horizontal deadband 91 is introduced to produce a null error signal when the integer number of DCO edges falling into one clock cycle is equal to the programmed FCW. In order to realize the bang-bang operation of the fine tuning loop, as described above, a vertical dead-band 92 is implemented in its transfer characteristic.

In a general aspect therefore, the first feedback loop is configured to control the number of cycles of the output frequency signal of the digital controlled oscillator between successive transitions of the reference clock signal and the second feedback loop 65 is configured to minimise a time difference between transitions of the output frequency signal of the digital controlled oscillator and corresponding transitions in the reference clock signal. The first feedback loop is preferably configured to alter a more significant respective part of the digital control word only when a number of cycles of the output frequency signal between successive reference clock signal transitions differs from the number of cycles indicated by the frequency control word by one or more cycle. The second feedback loop is preferably configured to alter a less significant respective part of the digital control word by one or more bits to minimise a time difference between transitions of the output frequency signal and corresponding transitions in the reference clock signal.

The fine tuning dynamics may also be adjusted based on whether the system is in the acquisition or in the steady-state tracking mode. In doing so, both a faster PLL settling time and an accurate frequency output can be achieved. By means of the bandwidth control block 68 (FIG. 6), the gain in the fine loop 65 can be modified to achieve an adaptive bandwidth.

Figure 10:
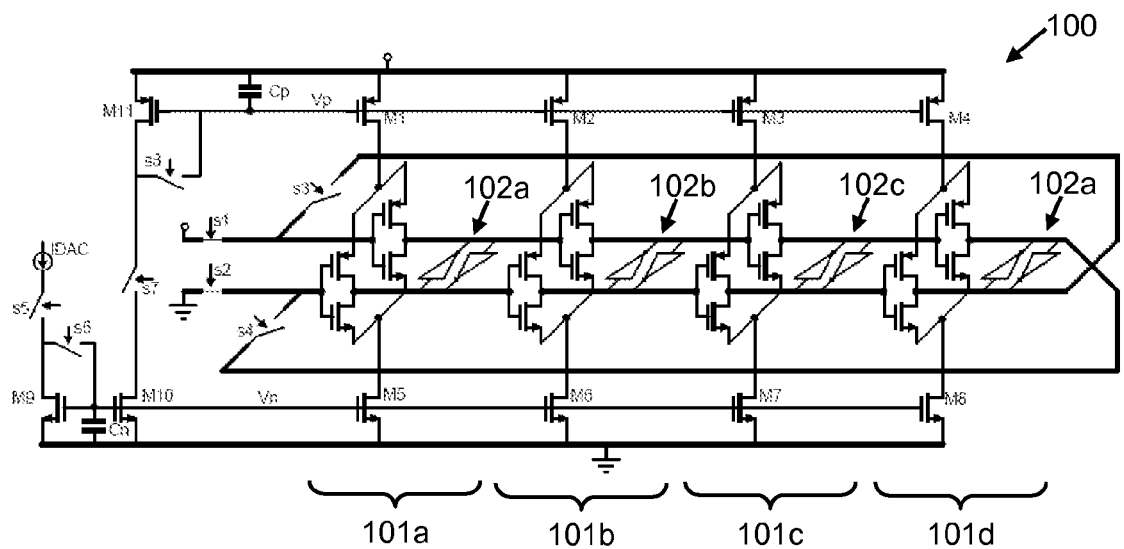
FIG. 10 is a schematic circuit diagram of a digital controlled oscillator for use with a duty-cycled ADPLL.

The exemplary DCPLL described herein can work only with a fast start-up DCO whose output frequency can settle within a single period of the reference clock, in the present case within 50 ns. Ring oscillators start up faster than LC oscillators, which require approximately Q periods, where Q is the quality factor of the LC tank, to reach steady-state, as for example disclosed in reference [6]. Additionally, if phase noise is not the main requirement, ring oscillators require less power than LC oscillators, as for example disclosed in reference [4]. Finally, since the DCO 61 will be turned off for a significant fraction of time, its static power consumption in idle mode should be very low. These considerations motivate the use of a ring oscillator, as for example shown in FIG. 10. The ring oscillator 100 consists of four delay stages 100a-d in a closed loop, driven by a current IDAC defined by the output of an R/2R ladder current DAC. Each delay stage 100a-d uses a pseudo-differential architecture. The frequency is controlled by the complementary voltages $V_p$ and $V_n$ at the gates of PMOS transistors $M_1$, $M_2$, $M_3$, $M_4$ and NMOS transistors $M_5$, $M_6$, $M_7$, $M_8$, the values of $V_p$ and $V_n$ being stored on two large gate capacitors $C_p$ and $C_n$.

The delay stages and input current from the digital to analog converter are switchable under control of one or more control signals from the duty cycle module 66 (FIG. 6). During the idle state, switches $s_1$ and $s_2$ are connected to $V_{dd}$ and Ground, respectively, while the final stage 101d of the delay line is disconnected from the first stage 101a by means of switches $s_3$ and $s_4$. Therefore, the oscillator's power consumption is determined by the leakage currents of the inverters 102a-d. Opening switches $s_1$ and $s_2$, and closing switches $s_3$ and $s_4$, configures the delay line as an oscillator whose output frequency depends on the control voltages $V_p$ and $V_n$. Most of the power dissipation of the oscillator is due to switching events (i.e. is proportional to $CV^2$). To synthesize the desired frequency, the per-stage delay is tuned to ⅛ of the desired RF cycle period by means of the DAC current source $I_{DAC}$ which sets the two voltages $V_p$ and $V_n$. The DCO start-up delay must be small with respect to the reference period. This requires that $C_p$ and $C_n$ be large capacitors and that the currents through the diodes $M_9$ and $M_{11}$ be large enough to set voltages $V_p$ and $V_n$ in a short time. To achieve this while maintaining a low power consumption, a preset phase preferably precedes the DCO's actual start-up. During this preset phase, which preferably starts one reference clock cycle before the DCO is started (shown in the timing diagram in FIG. 7), switches s5, s6, s7 and s8 are enabled and the generated current $I_{DAC}$ sets the voltage $V_p$ and $V_n$. When the DCO is started, the required voltages are already preset to their correct values, thus mitigating output frequency variations. The DCO is kept running for the required pulse period, typically one reference cycle, and then shut down by means of switches s1, s2, s3 and s4, which together configure the DCO again as an open-loop delay line. Switches s5, s6, s7 and s8 are opened to preserve the charge stored on capacitors $C_p$ and $C_n$ and the DAC is turned off to save power. In a general aspect therefore, the duty cycle module 66 is configured to provide a control signal to enable the digital controlled oscillator 61 in a preset phase using a digital control word stored by the feedback loop of circuit one or more reference clock cycles prior to enabling the output frequency signal from the synthesiser.

Figure 11A:
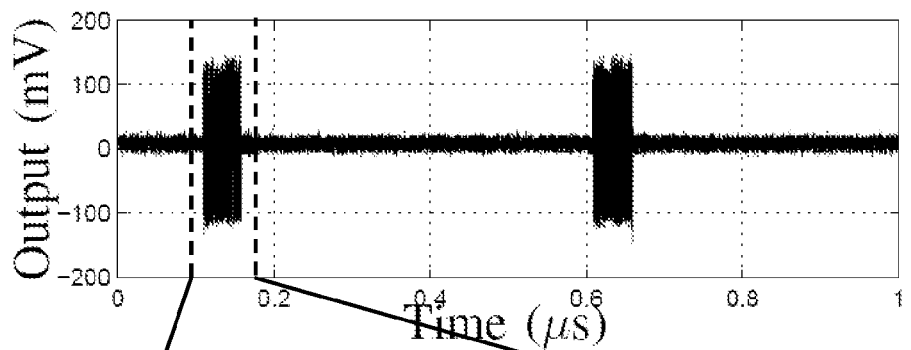
Figure 11B:
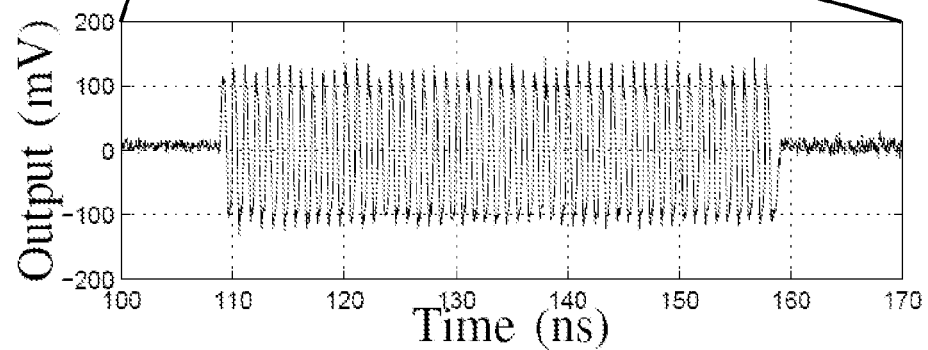
Figure 12:
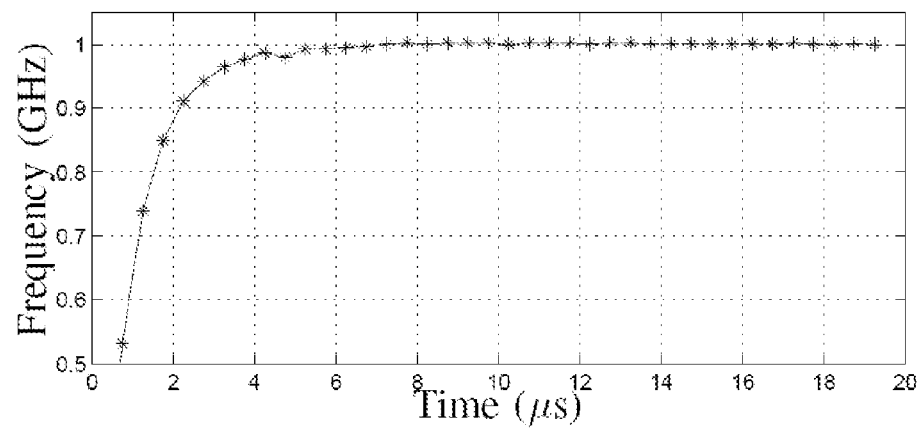
FIG. 12 illustrates a measurement of settling time for an exemplary duty-cycled ADPLL.
Figure 13:
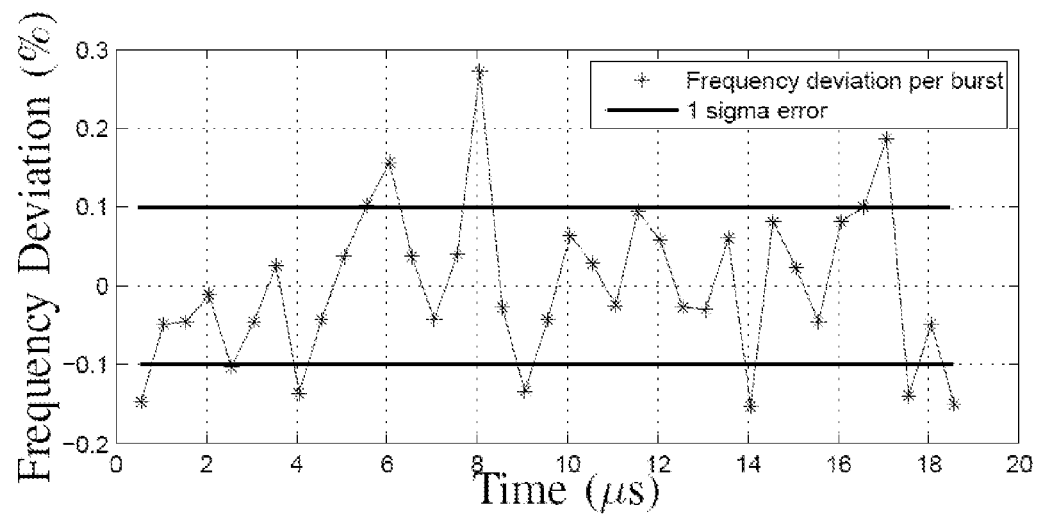
FIG. 13 illustrates a measured frequency deviation for an exemplary duty-cycled ADPLL as a function of time.

The oscillator as outlined above has been realized in a baseline TSMC 65 nm CMOS process. The output frequency can be programmed from 200 MHz to 1.2 GHz. The DCPLL output consisting of a train of bursts at 1 GHz with a 10% duty-cycle is shown in FIGS. 11a and 11b, with FIG. 11b showing a magnified view of a portion of the signal shown in FIG. 11a. The total current consumption at 1.3 V supply voltage is 200 μA (100 μA for the DCO; 60 μA for the current DAC; and 40 μA for the counter and PLL logic). The measured PLL settling time is shown in FIG. 12. Each point on the curve in FIG. 12 represents the average frequency within a single burst. After the generation of 15 bursts, or equivalently 7.5 µs, the output frequency settles to the programmed frequency with an error of around 0.1%. In the case shown, the initial frequency was set to 300 MHz by storing the appropriate DCW in the accumulator. After one calibration, the correct DCW is stored in the two accumulators 63a, 63b (FIG. 6) and the DCPLL is started from the correct condition. The DCPLL continuously monitors the output frequency to follow any temperature and voltage variations. FIG. 13 illustrates the frequency deviation from the programmed frequency (1 GHz in the present case or FCW=50) for 40 consecutive bursts after one process calibration. Each point represents the average frequency within each burst, while the two bold lines represent the 1σ error, i.e. the boundary lines of a single standard deviation from the mean frequency. The absence of the systematic 'bang-bang' frequency jumps confirms that the accuracy in the generated frequency is limited by the DCO phase noise. The simulated open loop DCO phase noise at 1 MHz offset is, indeed, −73 dBc/Hz resulting in a DCO period jitter of 7 ps (rms). After 50 DCO periods, the accumulated jitter for the $(FCW+1)^{th}$ edge is 50 ps, giving a time uncertainty of 0.1% with respect to the reference clock. This is in accordance with the measured 0.1% frequency error observed in FIG. 13. It can be seen that the fine tuning loop significantly improves the achieved accuracy; an error of 20 MHz (2%) would be obtained with only the main loop. The standard deviation of the frequency error represents an important parameter for the burst-mode frequency synthesizer since it replaces the closed-loop PLL phase noise.

Figure 14:
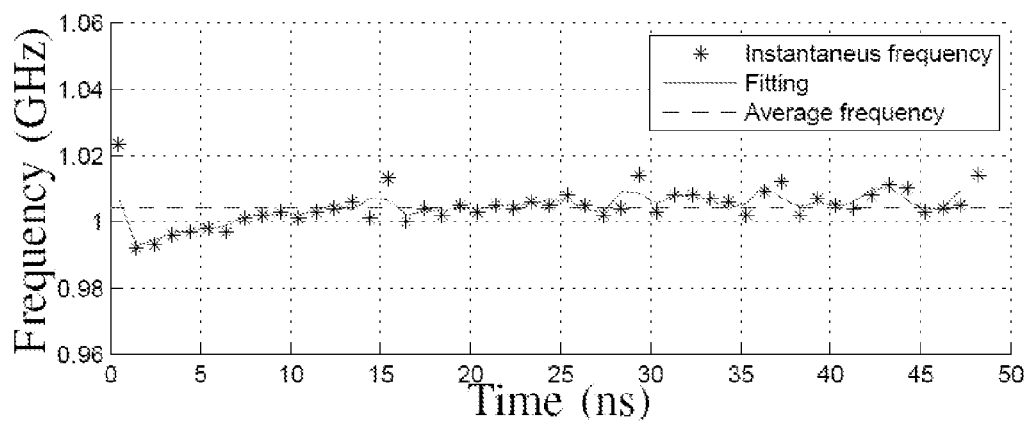
FIG. 14 illustrates a measured instantaneous frequency of the output from a DCO during a single burst for an exemplary duty-cycled ADPLL as a function of time.

To characterize the DCO's performances, its instantaneous DCO frequency during a burst was measured, the results of which are shown in FIG. 14, together with the interpolated frequency (taking a running average over two successive samples) and the mean frequency over a burst period. The DCO starts at approximately the correct frequency and takes a few DCO periods to settle. The DCPLL is not sensitive to this systematic variations but it tries to tune the average frequency (shown in FIG. 14 as dashed line). However, the deviation from the target frequency is maintained within few percent due to the preset strategy.

The above exemplary embodiment illustrates a fully-integrated duty-cycled frequency synthesizer, in which frequency multiplication inaccuracy due to noise amounts to around 0.1% (or 1σ). Such a PLL operating in burst mode can be used to generate an high frequency signal accurate enough for WSN applications while maintaining a low power, as for example required by energy autonomous sensor nodes.

The exemplary PLL described above can be operated at low duty-cycles, since it employs a fast start-up DCO, resulting in a highly energy-efficient synthesizer. The proposed PLL can be configured to generate signals having frequencies that range from several hundreds of MHz to more than 1 GHz, while maintaining a power consumption of a few hundreds of µW.

In conclusion the present invention is suitable for a pulse-based RF transceiver, in which the total power consumption is decreased by a factor equal to the duty-cycle of the signal, while remaining relatively insensitive to PVT variations.

Applications for the frequency synthesiser according to the invention include radio transmitters and/or receivers based on impulse radio modulation scheme.

Other embodiments are intentionally within the scope of the invention as defined by the appended claims.

REFERENCES

[1] Kajiwara, A.; Nakagawa, M., "*A new PLL frequency synthesizer with high switching speed*", Vehicular Technology, IEEE Transactions on, vol. 41, no. 4, pp. 407-413, November 1992

[2] Staszewski, R. B.; Balsara, P. T., "Phase-domain all-digital phase-locked loop", Circuits and Systems II: Express Briefs, IEEE Transactions on, vol. 52, no. 3, pp. 159-163, March 2005

[3] B. W. Cook, A. D. Berny, A. Molnar, S. Lanzisera, and K. S. J. Pister, "*An ultra-low power 2.4 GHz RF transceiver for wireless sensor networks in 0:13 µm CMOS with 400 mV supply and an integrated passive RX front-end*", in ISSCC Digest of Technical Papers., August 2006, pp. 258-259.

[4] N. Pletcher, S. Gambini, and J. Rabaey, "*A 52 µW Wake-Up Receiver With −72 dBm Sensitivity Using an Uncertain-IF Architecture*", Solid-State Circuits, IEEE Journal of, vol. 44, no. 1, pp. 269-280, January 2009.

[5] F. Sebastiano, S. Drago, L. Breems, D. Leenaerts, K. Makinwa, and B. Nauta, "*Impulse based scheme for crystal-less ULP radios*", in Proc. ISCAS, May 2008, pp. 1508-1511.

[6] D. Wentzloff and A. Chandrakasan, "*A 47 pJ/pulse 3.1-to-5 GHz All-Digital UWB transmitter in 90 nm CMOS*", in ISSCC Digest of Technical Papers, February 2007, pp. 118-591.

The invention claimed is:

1. A low power frequency synthesiser circuit, comprising:
a digital controlled oscillator configured to generate an output signal having a frequency controlled by an input digital control word;
a feedback loop connected between an output and an input of the digital controlled oscillator, the feedback loop configured to provide the digital control word to the input of the digital controlled oscillator from an error derived from an input frequency control word and the output signal; and
a duty cycle module connected to the digital controlled oscillator and the feedback loop, the duty cycle module configured to generate a plurality of control signals to periodically enable and disable the digital controlled oscillator for a set fraction of clock cycles of an input reference clock signal;
wherein the feedback loop comprises a first feedback loop configured to provide a first part of the digital control word for coarse control of the frequency of the output signal of the digital controlled oscillator and a second feedback loop configured to provide a second part of the digital control word for fine control of the frequency of the output signal of the digital controlled oscillator; and
wherein
the first feedback loop includes
a counter module configured and arranged to count a number of clock cycles in the output signal of the digital controlled oscillator in each clock cycle of the input reference clock signal, and
a first subtractor configured and arranged to generate the first part of the digital control word based on a difference between the number of clock cycles indicated by the counter and a first part of the frequency control word; and
the second feedback loop includes
the counter module, and
a second subtractor configured and arranged to generate the second part of the digital control word based on a difference between the number of clock cycles indicated by the counter and a second part of the frequency control word.

2. The frequency synthesiser circuit of claim 1, wherein:
the duty cycle module is configured to, for each set of a plurality of consecutive sets of M clock cycles of the input reference clock signal, enable the digital controlled oscillator for a first N consecutive clock cycles of the M clock cycles of the set and disable the digital controlled oscillator for the last P clock cycles of the M clock cycles of the set, where P=M−N; and
the feedback loop is configured to store the digital control word in response to one of the plurality of control signals and to use the stored digital control word in controlling the digital controlled oscillator when the digital controlled oscillator is subsequently enabled.

3. The frequency synthesiser circuit of claim 1, wherein the duty cycle module comprises a finite state machine configured to generate the plurality of control signals driven by the reference clock signal, and the set fraction of clock cycles is based on a duty-cycle of the digital controlled oscillator.

4. The frequency synthesiser circuit of claim 2, wherein the duty cycle module is configured to provide a control signal to enable the digital controlled oscillator in a preset phase using the stored digital control word for one or more reference clock cycles prior to enabling the output signal from the synthesiser.

5. The frequency synthesiser circuit of claim 1, wherein the duty cycle module is configured to modulate a temporal position of successive pulses generated by the digital controlled oscillator according to an input data signal.

6. The frequency synthesiser circuit of claim 1, wherein the feedback loop comprises a counter module and a phase difference module, the counter module being configured to count cycles of the output signal from the digital controlled oscillator while the digital controlled oscillator is enabled and to provide a output phase signal to the phase difference module, the phase difference module configured to receive the input frequency control word and the output phase signal and to provide an error signal output to determine the digital control word.

7. The frequency synthesiser circuit of claim 6, wherein the duty cycle module is configured to reset the counter when enabling the digital controlled oscillator with one of the plurality of control signals.

8. The frequency synthesiser circuit of claim 1, wherein:
the first feedback loop is configured to control a number of cycles of the output signal of the digital controlled oscillator between successive transitions of the reference clock signal, and the second feedback loop is configured to minimize a time difference between transitions of the output signal of the digital controlled oscillator and corresponding transitions in the reference clock signal.

9. The frequency synthesiser circuit of claim 1, wherein the first and second feedback loops comprise an accumulator module configured to provide respective parts of the digital control word and to store the parts of the digital control word when the digital controlled oscillator is disabled.

10. The frequency synthesiser circuit of claim 9, wherein the first feedback loop is configured to alter a more significant respective part of the digital control word only when a number of cycles of the output signal between successive reference clock signal transitions differs from the number of cycles indicated by the frequency control word by one or more cycle.

11. The frequency synthesiser circuit of claim 10, wherein the second feedback loop is configured to alter a less significant respective part of the digital control word by one or more bits to minimize a time difference between transitions of the output signal and corresponding transitions in the reference clock signal.

12. An integrated circuit comprising the frequency synthesiser of claim 1.

13. The frequency synthesiser circuit of claim 1, wherein the periodic enabling and disabling of the digital controlled oscillator, by the duty cycle module, for the set fraction of clock cycles of the input reference clock signal includes periodically alternating between:
enabling the digital controlled oscillator for a first number of the clock cycles; and
disabling the digital controlled oscillator for a second number of the clock cycles.

14. The frequency synthesiser circuit of claim 13, wherein the disabling of the digital controlled oscillator includes disabling one or more circuits included in the feedback loop.

15. The frequency synthesiser circuit of claim 1, wherein the error derived from an input frequency control word and the output signal indicates a phase difference between a reference phase and the output signal.

16. The frequency synthesiser circuit of claim 15, further comprising:
an accumulation circuit configured and arranged to accumulate the input frequency control word to produce the reference phase.

17. The frequency synthesiser circuit of claim 1, wherein the first feedback loop exhibits a transfer function, in which the first part of the digital control word generated by the first subtractor is null when the number of clock cycles indicated by the counter is equal to the first part of the frequency control word.

* * * * *